US012016166B2

(12) United States Patent
Kuo et al.

(10) Patent No.: US 12,016,166 B2
(45) Date of Patent: Jun. 18, 2024

(54) ELECTRONIC DEVICE AND SHIELDING STRUCTURE THEREOF

(71) Applicant: Wistron NeWeb Corp., Hsinchu (TW)

(72) Inventors: Yu-Ting Kuo, Hsinchu (TW); Yung-Jinn Chen, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 364 days.

(21) Appl. No.: 17/471,495

(22) Filed: Sep. 10, 2021

(65) Prior Publication Data

US 2022/0232743 A1  Jul. 21, 2022

(30) Foreign Application Priority Data

Jan. 15, 2021 (TW) .................................. 110101594

(51) Int. Cl.
*H05K 9/00* (2006.01)
*H01R 13/6582* (2011.01)

(52) U.S. Cl.
CPC ....... *H05K 9/0032* (2013.01); *H01R 13/6582* (2013.01); *H05K 9/0007* (2013.01); *H05K 9/0009* (2013.01); *H05K 9/0018* (2013.01); *H05K 9/0024* (2013.01)

(58) Field of Classification Search
CPC .. H05K 9/0007; H05K 9/0009; H05K 9/0032; H05K 9/0018; H05K 9/0024; H05K 9/003; H01R 13/6582; H01R 12/716; H01R 12/73
USPC ......................................................... 361/816
See application file for complete search history.

(56) References Cited

U.S. PATENT DOCUMENTS

| | | | |
|---|---|---|---|
| 5,725,394 A | 3/1998 | Banakis et al. | |
| 6,773,275 B1* | 8/2004 | Chen | H01R 13/6485 439/947 |
| 9,413,115 B1* | 8/2016 | Henry | H01R 13/6582 |
| 2002/0072274 A1* | 6/2002 | Flickinger | H05K 9/0058 439/607.2 |
| 2011/0053415 A1* | 3/2011 | Fonteneau | H05K 9/0058 361/816 |
| 2021/0013680 A1* | 1/2021 | Sasada | H01R 12/721 |
| 2021/0194173 A1* | 6/2021 | Yang | H01R 13/6594 |
| 2021/0288447 A1* | 9/2021 | Sharf | H05K 9/0016 |

FOREIGN PATENT DOCUMENTS

| | | |
|---|---|---|
| TW | 379871 U | 1/2000 |
| TW | M416918 U | 11/2011 |
| TW | M523217 U | 6/2016 |

* cited by examiner

*Primary Examiner* — Zhengfu J Feng
(74) *Attorney, Agent, or Firm* — McClure, Qualey & Rodack, LLP

(57) ABSTRACT

An electronic device is provided. The electronic device includes a circuit board, a connector, a shielding frame and a shielding cover. The connector is disposed on the circuit board. The shielding frame is disposed on the circuit board, wherein the connector is disposed in the shielding frame. The shielding cover is detachably connected to the shielding frame, wherein when the shielding cover is combined with the shielding frame, an inlet is formed between the shielding frame and the shielding cover, and the shielding frame and the shielding cover are adapted to block an interference signal.

14 Claims, 6 Drawing Sheets

ELECTRONIC DEVICE AND SHIELDING STRUCTURE THEREOF

CROSS REFERENCE TO RELATED APPLICATIONS

This Application claims priority of Taiwan Patent Application No. 110101594, filed on Jan. 15, 2021, the entirety of which is incorporated by reference herein.

BACKGROUND OF THE INVENTION

Field of the Invention

The present invention relates to an electronic device, and in particular to an electronic device with a shielding structure.

Description of the Related Art

Conventional electronic devices include a circuit board, a connector, and a module card (such as a wireless communication card). The connector is disposed on the circuit board. The module card is inserted into the connector to be coupled to the circuit board. The connector is commonly formed by plastic packaging. When the high-speed transmitted signal of the module card passes through the connector, this generates a high-frequency noise. The high-frequency noise may be received by the antenna of the electronic device, causing serious signal interference.

Additionally, the module card may need to be inserted into the connector at a particular insertion angle (for example, the M.2 card needs to be inserted into the connector at a tilted insertion angle). Therefore, it is difficult to provide a shielding structure which can sufficiently cover the connector, because the module card may collide with the shielding structure during insertion.

BRIEF SUMMARY OF THE INVENTION

Embodiments of the invention are provided to address the aforementioned difficulty.

In one embodiment, an electronic device is provided. The electronic device includes a circuit board, a connector, a shielding frame and a shielding cover. The connector is disposed on the circuit board. The shielding frame is disposed on the circuit board, wherein the connector is disposed in the shielding frame. The shielding cover is detachably connected to the shielding frame, wherein when the shielding cover is combined with the shielding frame, an inlet is formed between the shielding frame and the shielding cover, and the shielding frame and the shielding cover are adapted to block an interference signal.

In one embodiment, the electronic device further comprises a module card, wherein the module card is adapted to pass through the inlet and connect to the connector.

In one embodiment, the shielding cover comprises a first elastic coupling unit, and the first elastic coupling unit is adapted to connect to a first side of the module card.

In one embodiment, the shielding frame comprises a second elastic coupling unit, which is adapted to connect to the second side of the module card. The second side is opposite the first side. The first elastic coupling unit and/or the second elastic coupling unit is directly coupled to the module card.

In one embodiment, the module card comprises a first shielding member, the first shielding member is disposed on the first side, and the first elastic coupling unit abuts the first shielding member.

In one embodiment, the module card comprises a second shielding member, the second shielding member is disposed on the second side, and the second elastic coupling unit abuts the second shielding member.

In one embodiment, the module card comprises a ground window, and the first elastic coupling unit or the second elastic coupling unit is directly coupled to the module card via the ground window.

In one embodiment, the elastic coupling unit comprises a plurality of first elastic sheets, the first elastic sheets extend in a first direction, each first elastic sheet comprises a first curved portion, and the first curved portion is adapted to abut the first side of the module card.

In one embodiment, the second elastic coupling unit comprises a plurality of second elastic sheets, the second elastic sheets extend in a second direction, each second elastic sheet comprises a second curved portion, the second curved portion is adapted to abut the second side of the module card, and the first direction is opposite to the second direction.

In one embodiment, a second gap is formed between the two adjacent second elastic sheets, and the second gap is ⅟₅₀~⅟₂₀ of the wavelength of the interference signal.

In one embodiment, a first gap is formed between the two adjacent first elastic sheets, and the first gap is ⅟₅₀~⅟₂₀ of the wavelength of the interference signal.

In one embodiment, the shielding frame comprises a plurality of frame wedging portions, the shielding cover comprises a plurality of cover wedging portions, and the cover wedging portions are adapted to wedge the frame wedging portions.

In one embodiment, the frame wedging portions are protrusions, and the cover wedging portions are recesses.

In one embodiment, the shielding frame comprises a first frame sidewall, a second frame sidewall and a third frame sidewall, the first frame sidewall is parallel to the third frame sidewall, the second frame sidewall is perpendicular to the first frame sidewall, the second frame sidewall corresponds to the inlet, and the frame wedging portions are formed on the first frame sidewall, the second frame sidewall and the third frame sidewall.

In one embodiment, the shielding cover further comprises a cable management slot.

In one embodiment, a shielding structure is provided. The shielding structure includes a shielding frame and a shielding cover. The shielding cover is detachably connected to the shielding frame, wherein when the shielding cover is combined with the shielding frame, an inlet is formed between the shielding frame and the shielding cover, and the shielding frame and the shielding cover are adapted to block an interference signal.

The shielding structure can sufficiently cover the connector, blocking the interference signal, and decreasing the amount of noise. The shielding structure of the embodiment of the invention includes the shielding cover and the shielding frame. When the user inserts the module card (such as M.2 module card) into the connector, the shielding cover can be removed from the shielding frame to prevent the shielding cover from being interfered with by the module card. After the module card is combined with the connector, the shielding cover can be rejoined with the shielding frame to provide a sufficient shielding effect. The shielding cover can be repeatedly combined with the shielding frame and detached from the shielding frame, and it is convenient for the user.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
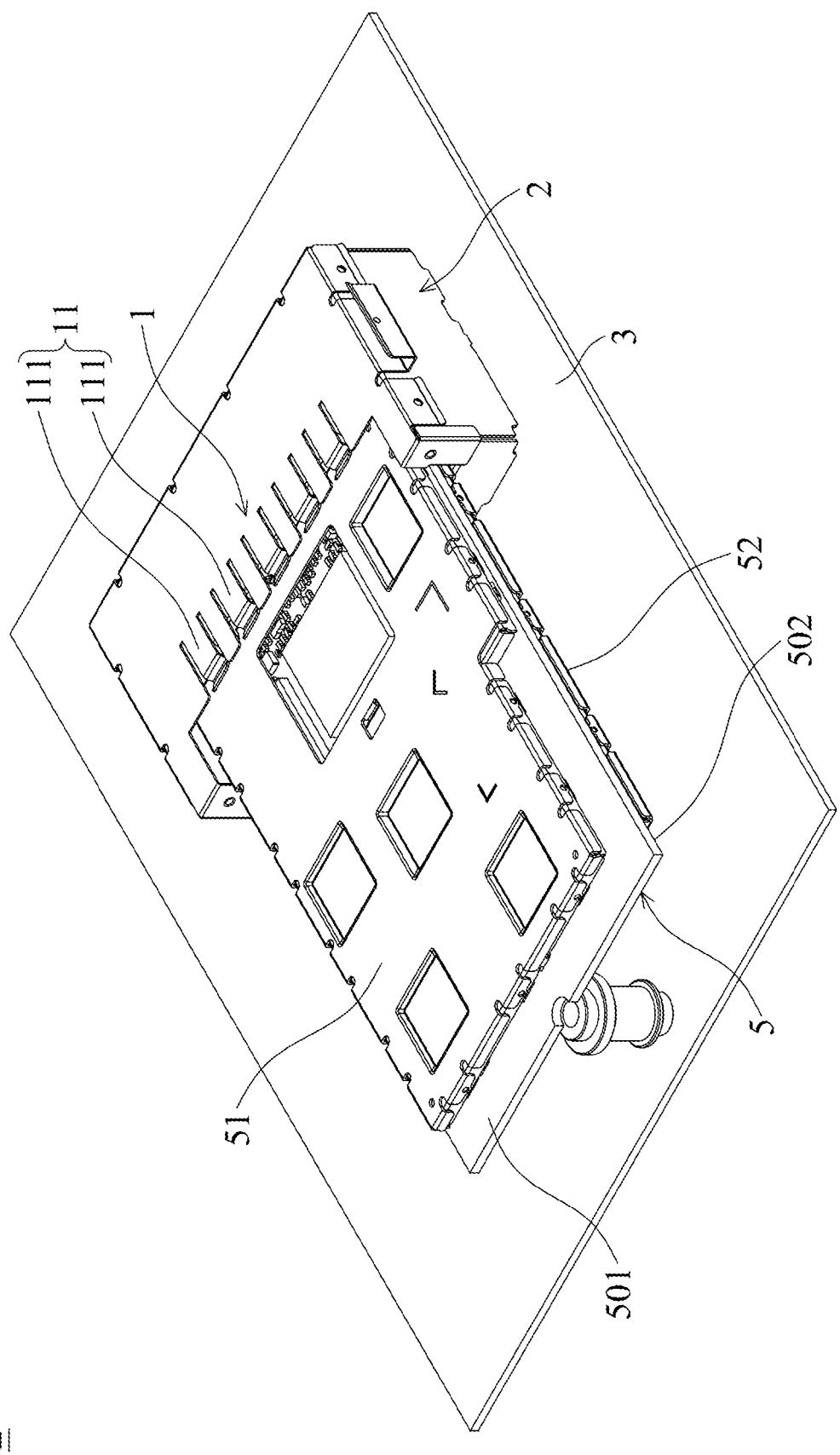
FIG. 1A shows an electronic device of an embodiment of the invention, wherein a module card is combined with the electronic device.
Figure 1B:
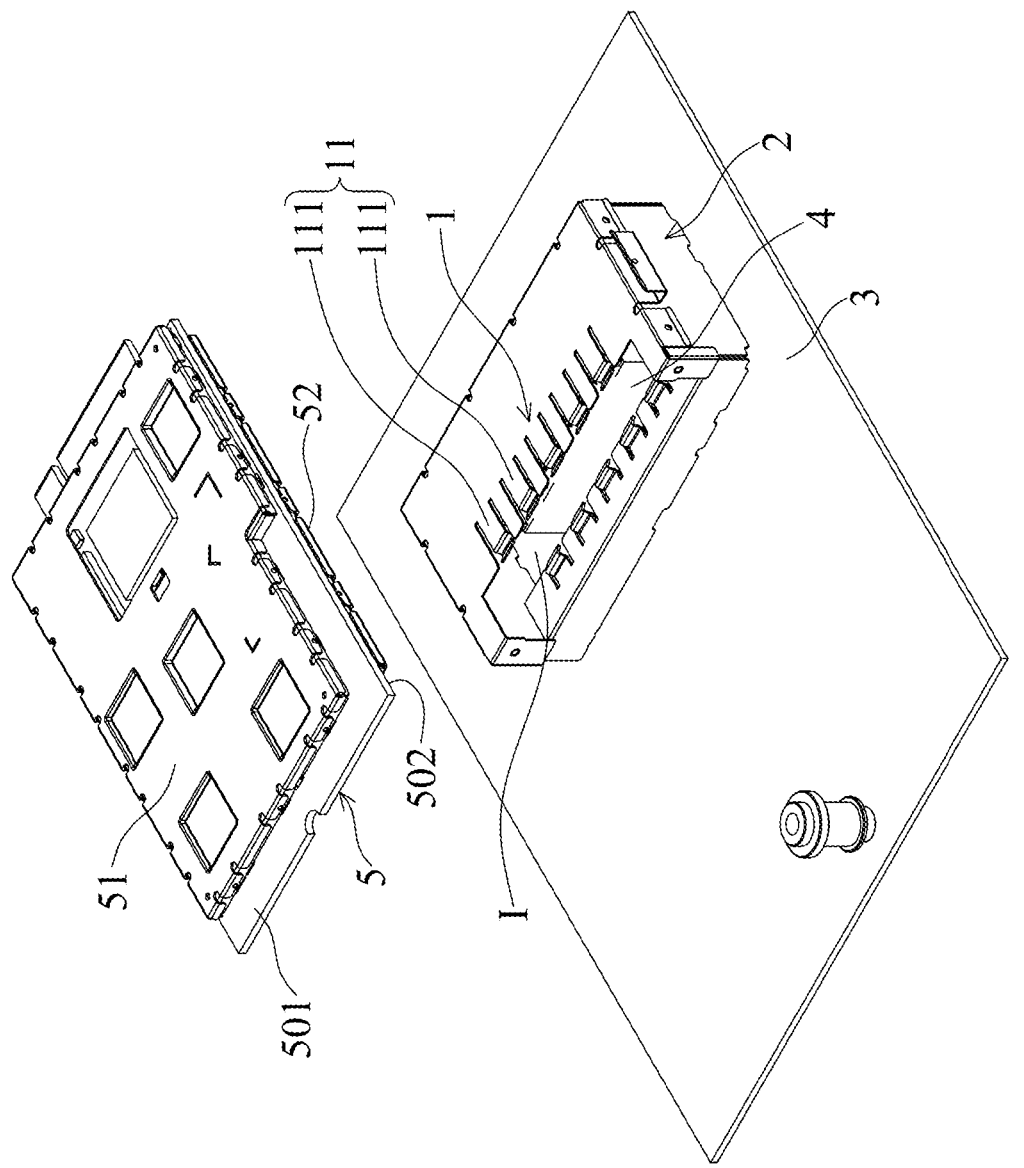
FIG. 1B shows the electronic device of the embodiment of the invention, wherein the module card is not combined with the electronic device.

FIG. 1A shows an electronic device of an embodiment of the invention, wherein a module card is combined with the electronic device. FIG. 1B shows the electronic device of the embodiment of the invention, wherein the module card is not combined with the electronic device. With reference to FIGS. 1A and 1B, the electronic device E of the embodiment of the invention includes a circuit board 3, a connector 4, a shielding frame 2 and a shielding cover 1. The connector 4 is disposed on the circuit board 3. The shielding frame 2 is disposed on the circuit board 3. The connector 4 is disposed in the shielding frame 2. The shielding cover 1 is detachably connected to the shielding frame 2. When the shielding cover 1 is combined with the shielding frame 2, an inlet I is formed between the shielding frame 2 and the shielding cover 1, and the shielding frame 2 and the shielding cover 1 are adapted to block an interference signal. In one embodiment, the electronic device E further comprises a module card 5, wherein the module card 5 is adapted to pass through the inlet I and connect to the connector 4.

Figure 2:
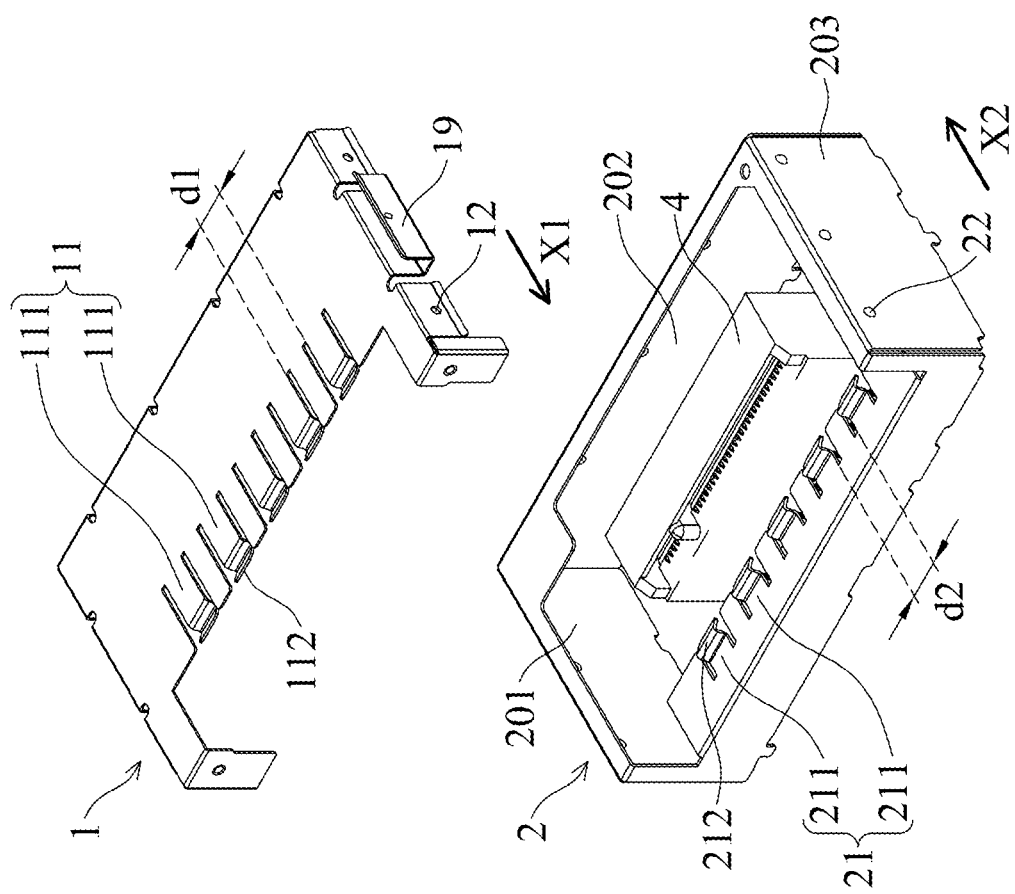
FIG. 2 is an exploded view of the shielding frame and the shielding cover of the embodiment of the invention.
Figure 3:
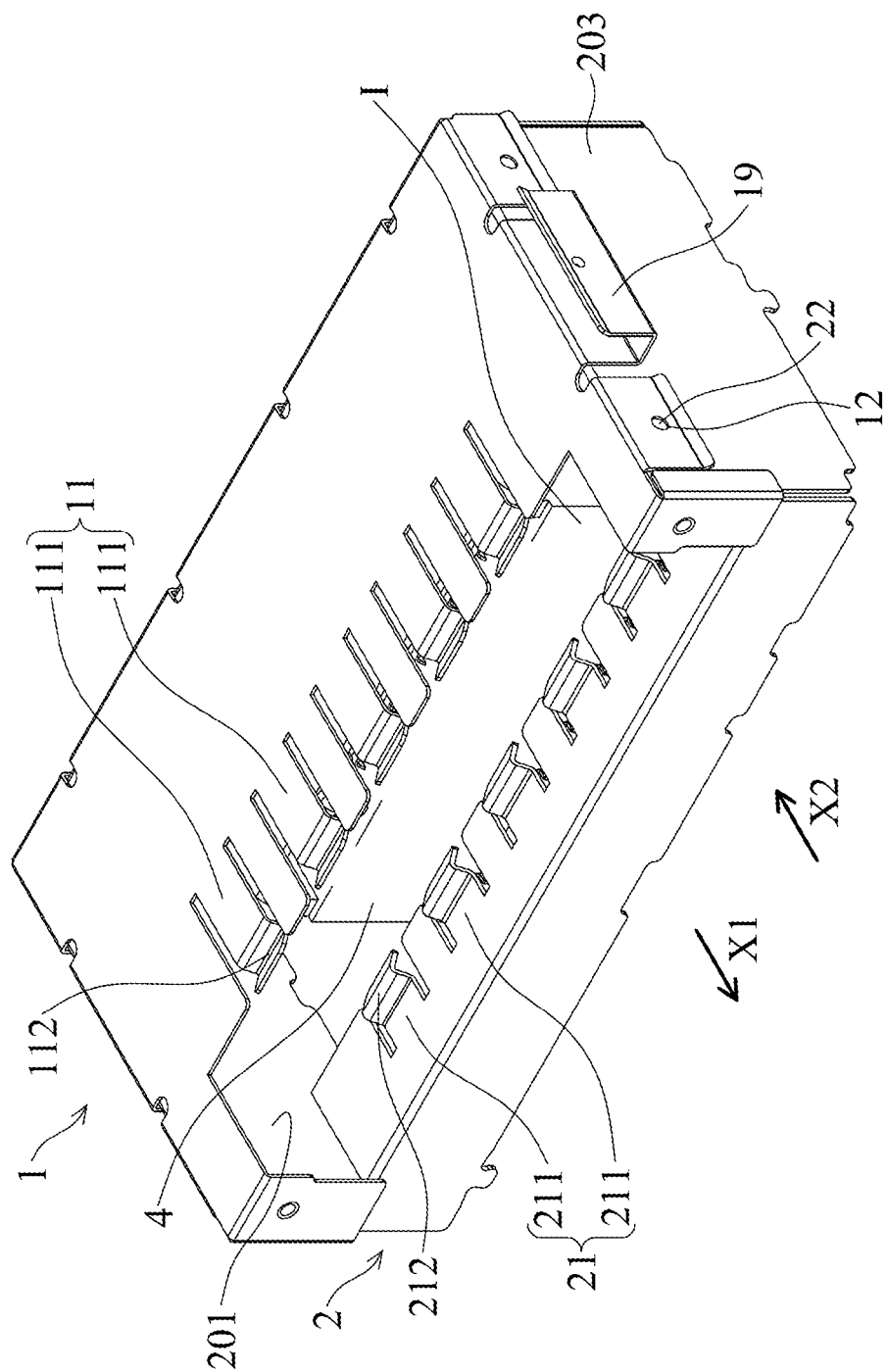
FIG. 3 is an assembled view of the shielding frame and the shielding cover of the embodiment of the invention.

FIG. 2 is an exploded view of the shielding frame and the shielding cover of the embodiment of the invention. FIG. 3 is an assembled view of the shielding frame and the shielding cover of the embodiment of the invention. With reference to FIGS. 1A, 2 and 3, in one embodiment, the shielding cover 1 comprises a first elastic coupling unit 11, and the first elastic coupling unit 11 is adapted to connect to a first side 501 of the module card 5.

With reference to FIGS. 1A, 2 and 3, in one embodiment, the shielding frame 2 comprises a second elastic coupling unit 21. The second elastic coupling unit 21 is adapted to connect a second side 502 of the module card 5. The second side 502 is opposite to the first side 501.

Figure 4:
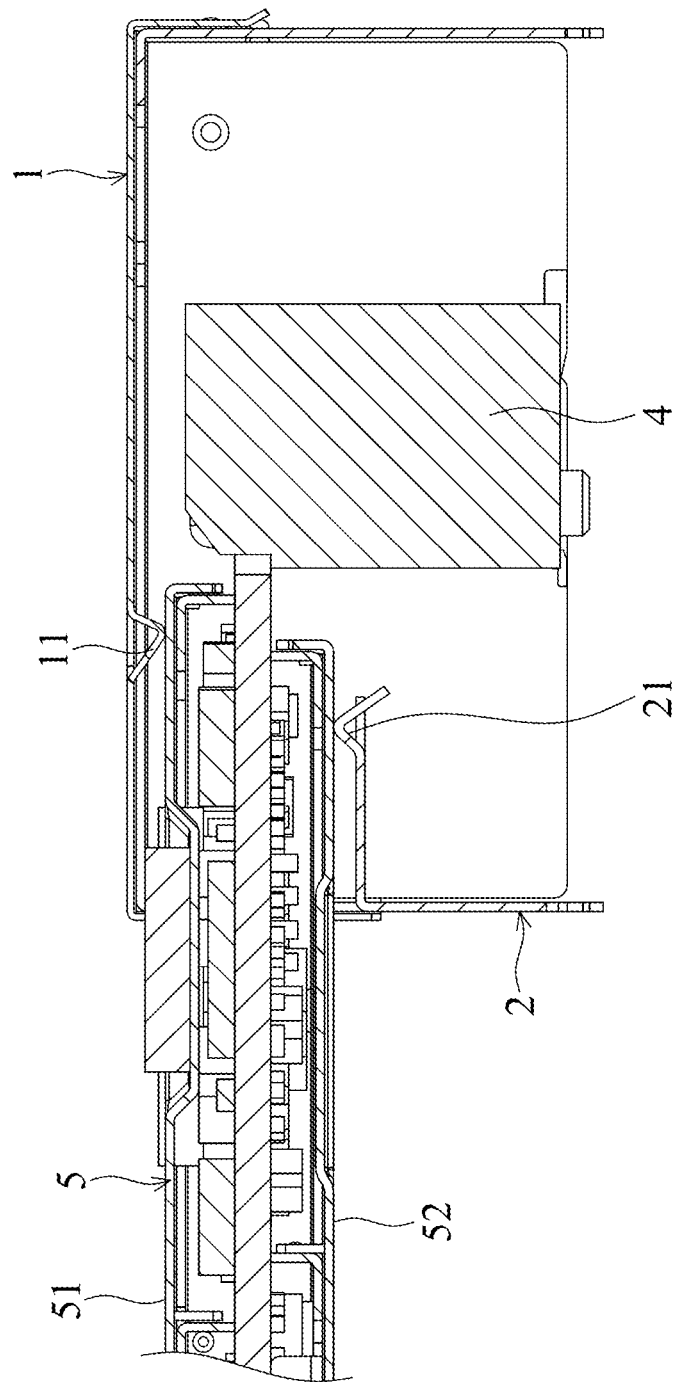
FIG. 4 is a cross-sectional view of the electronic device of the embodiment of the invention.

FIG. 4 is a cross-sectional view of the electronic device of the embodiment of the invention. With reference to FIGS. 1A, 2 and 4, in one embodiment, the first elastic coupling unit 11 and/or the second elastic coupling unit 21 is directly coupled to the module card. With reference to FIG. 1A, in one embodiment, the module card 5 comprises a first shielding member 51. The first shielding member 51 is disposed on the first side 501. The first elastic coupling unit 11 abuts the first shielding member 51, and the first elastic coupling unit 11 is grounded by being coupled to the first shielding member 51. In one embodiment, the module card 5 comprises a second shielding member 52. The second shielding member 52 is disposed on the second side 502. The second elastic coupling unit 21 abuts the second shielding member 52, and the second elastic coupling unit 21 is grounded by being coupled to the second shielding member 52. In this embodiment, the first elastic coupling unit 11 and the second elastic coupling unit 21 elastically abut the module card 5 and are coupled to the module card 5. However, the disclosure is not meant to restrict the invention. For example, the first elastic coupling unit 11 and the second elastic coupling unit 21 may be wedged to the module card 5 and are coupled to the module card 5.

Figure 5:
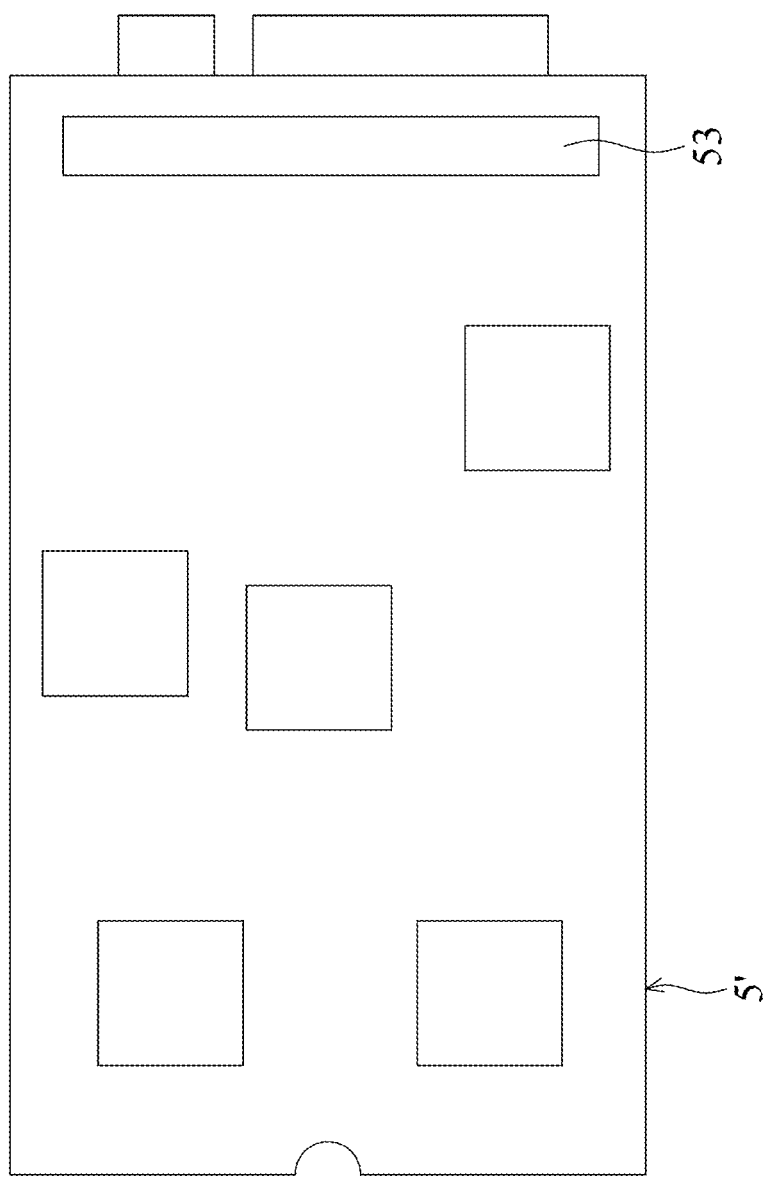
FIG. 5 shows a module card of another embodiment of the invention.

FIG. 5 shows a module card of another embodiment of the invention. With reference to FIG. 5, in another embodiment, the module card 5' comprises a ground window 53. The first elastic coupling unit 11 is directly coupled to a ground layer of the module card 5' via the ground window 53. In another embodiment, the second elastic coupling unit 21 can be directly coupled to the ground layer of the module card via the ground window. The disclosure is not meant to restrict the invention.

In the embodiment of the invention, the first elastic coupling unit and/or the second elastic coupling unit is directly coupled to the module card. The shielding structure (including the shielding frame and the shielding cover) is grounded. The high-frequency noise (interference signal) is blocked from leaking.

With reference to FIGS. 2 and 3, in one embodiment, the elastic coupling unit 11 comprises a plurality of first elastic sheets 111. The first elastic sheets 111 extend in a first direction X1. Each first elastic sheet 111 comprises a first curved portion 112. The first curved portion 112 is adapted to abut the first side of the module card. In this embodiment, the first curved portion 112 is adapted to abut the first shielding member 51 on the first side of the module card.

With reference to FIGS. 2 and 3, in one embodiment, the second elastic coupling unit 21 comprises a plurality of second elastic sheets 211. The second elastic sheets 211 extend in a second direction X2. Each second elastic sheet 211 comprises a second curved portion 212. The second curved portion 212 is adapted to abut the second side of the module card. The first direction X1 is opposite to the second direction X2. In this embodiment, the second curved portion 212 is adapted to abut the second shielding member 52 on the second side of the module card.

With reference to FIG. 2, in one embodiment, a first gap d1 is formed between the two adjacent first elastic sheets 111, and the first gap d1 is $1/50 \sim 1/20$ of the wavelength of the interference signal. By the value of the first gap being $1/50 \sim 1/20$ of the wavelength of the interference signal, the shielding ability of the shielding structure toward the interference signal is improved.

With reference to FIG. 2, in one embodiment, a second gap d2 is formed between the two adjacent second elastic sheets 211, and the second gap d2 is 1/50~1/20 of the wavelength of the interference signal. By the value of the second gap being 1/50~1/20 of the wavelength of the interference signal, the shielding ability of the shielding structure toward the interference signal is improved.

With reference to FIGS. 2 and 3, in one embodiment, the shielding frame 2 comprises a plurality of frame wedging portions 22. The shielding cover 1 comprises a plurality of cover wedging portions 12. The cover wedging portions 12 are adapted to wedge the frame wedging portions 22. In one embodiment, the frame wedging portions 22 are protrusions, and the cover wedging portions 12 are recesses. However, the disclosure is not meant to restrict the invention. In another embodiment, the frame wedging portions 22 can be recesses, and the cover wedging portions 12 can be protrusions. Utilizing the cover wedging portions and the frame wedging portions of the embodiment of the invention, the shielding cover can be repeatedly combined with the shielding frame and detached from the shielding frame, and it is convenient to user.

With reference to FIGS. 2 and 3, in one embodiment, the shielding frame 2 comprises a first frame sidewall 201, a second frame sidewall 202 and a third frame sidewall 203. The first frame sidewall 201 is parallel to the third frame sidewall 203. The second frame sidewall 202 is perpendicular to the first frame sidewall 201. The second frame sidewall 202 corresponds to the inlet I. The frame wedging portions 22 are formed on the first frame sidewall 201, the second frame sidewall 202 and the third frame sidewall 203.

With reference to FIGS. 2 and 3, in one embodiment, the shielding cover 1 further comprises a cable management slot 19. The cable inside the electronic device can be restricted by the cable management slot 19.

The shielding structure can sufficiently cover the connector, blocking the interference signal, and decreasing the amount of noise. The shielding structure of the embodiment of the invention includes the shielding cover and the shielding frame. When the user inserts the module card (such as M.2 module card) into the connector, the shielding cover can be removed from the shielding frame to prevent the shielding cover from being interfered with by the module card. After the module card is combined with the connector, the shielding cover can be rejoined with the shielding frame to provide a sufficient shielding effect. The shielding cover can be repeatedly combined with the shielding frame and detached from the shielding frame, and it is convenient for the user.

In one embodiment of the invention, the electronic device and be a wireless communication device. The module card can be a wireless communication card. The disclosure is not meant to restrict the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a circuit board;
   a connector, disposed on the circuit board;
   a shielding frame, disposed on the circuit board, wherein the connector is disposed in the shielding frame;
   a shielding cover, detachably connected to the shielding frame, wherein when the shielding cover is combined with the shielding frame, an inlet is formed between the shielding frame and the shielding cover, and the shielding frame and the shielding cover are adapted to block an interference signal; and
   a module card, wherein the module card is adapted to pass through the inlet and connect to the connector,
   wherein the shielding cover comprises a first elastic coupling unit, and the first elastic coupling unit is adapted to connect to a first side of the module card,
   wherein the shielding frame comprises a second elastic coupling unit, the second elastic coupling unit is adapted to connect a second side of the module card, the second side is opposite to the first side, and at least one of the first elastic coupling unit and the second elastic coupling unit is directly coupled to the module card,
   wherein the elastic coupling unit comprises a plurality of first elastic sheets, the first elastic sheets extend in a first direction, each first elastic sheet comprises a first curved portion, and the first curved portion is adapted to abut the first side of the module card,
   wherein a first gap is formed between two adjacent ones of the first elastic sheets, and the first gap is 1/50~1/20 of a wavelength of the interference signal.

2. The electronic device as claimed in claim 1, wherein the module card comprises a first shielding member, the first shielding member is disposed on the first side, and the first elastic coupling unit abuts the first shielding member.

3. The electronic device as claimed in claim 1, wherein the module card comprises a second shielding member, the second shielding member is disposed on the second side, and the second elastic coupling unit abuts the second shielding member.

4. The electronic device as claimed in claim 1, wherein the module card comprises a ground window, and the first elastic coupling unit or the second elastic coupling unit is directly coupled to the module card via the ground window.

5. The electronic device as claimed in claim 1, wherein the second elastic coupling unit comprises a plurality of second elastic sheets, the second elastic sheets extend in a second direction, each second elastic sheet comprises a second curved portion, the second curved portion is adapted to abut the second side of the module card, and the first direction is opposite to the second direction.

6. The electronic device as claimed in claim 5, wherein a second gap is formed between two adjacent ones of the second elastic sheets, and the second gap is 1/50~1/20 of the wavelength of the interference signal.

7. The electronic device as claimed in claim 1, wherein the shielding frame comprises a plurality of frame wedging portions, the shielding cover comprises a plurality of cover wedging portions, and the cover wedging portions are adapted to wedge the frame wedging portions.

8. The electronic device as claimed in claim 7, wherein the frame wedging portions are protrusions, and the cover wedging portions are recesses.

9. The electronic device as claimed in claim 7, wherein the shielding frame comprises a first frame sidewall, a second frame sidewall and a third frame sidewall, the first frame sidewall is parallel to the third frame sidewall, the second frame sidewall is perpendicular to the first frame sidewall, the second frame sidewall corresponds to the inlet, and the frame wedging portions are formed on the first frame sidewall, the second frame sidewall and the third frame sidewall.

10. The electronic device as claimed in claim 7, wherein the shielding cover further comprises a cable management slot.

11. A shielding structure, comprising:
a shielding frame; and
a shielding cover, detachably connected to the shielding frame, wherein when the shielding cover is combined with the shielding frame, an inlet is formed between the shielding frame and the shielding cover, and the shielding frame and the shielding cover are adapted to block an interference signal,
wherein the shielding cover comprises a first elastic coupling unit, the shielding frame comprises a second elastic coupling unit, the first elastic coupling unit comprises a plurality of first elastic sheets, the first elastic sheets extend in a first direction, each first elastic sheet comprises a first curved portion, the second elastic coupling unit comprises a plurality of second elastic sheets, the second elastic sheets extend in a second direction, each second elastic sheet comprises a second curved portion, and the first direction is opposite to the second direction,
wherein a first gap is formed between two adjacent ones of the first elastic sheets, the first gap is $1/50 \sim 1/20$ of a wavelength of the interference signal, a second gap is formed between two adjacent ones of the second elastic sheets, and the second gap is $1/50 \sim 1/20$ of the wavelength of the interference signal.

12. The shielding structure as claimed in claim 11, wherein the shielding frame comprises a plurality of frame wedging portions, the shielding cover comprises a plurality of cover wedging portions, the cover wedging portions are adapted to wedge the frame wedging portions, and the frame wedging portions are protrusions, and the cover wedging portions are recesses.

13. The shielding structure as claimed in claim 12, wherein the shielding frame comprises a first frame sidewall, a second frame sidewall and a third frame sidewall, the first frame sidewall is parallel to the third frame sidewall, the second frame sidewall is perpendicular to the first frame sidewall, the second frame sidewall corresponds to the inlet, and the frame wedging portions are formed on the first frame sidewall, the second frame sidewall and the third frame sidewall.

14. A shielding structure, comprising:
a shielding frame; and
a shielding cover, detachably connected to the shielding frame, wherein when the shielding cover is combined with the shielding frame, an inlet is formed between the shielding frame and the shielding cover, and the shielding frame and the shielding cover are adapted to block an interference signal,
wherein the shielding cover comprises a first elastic coupling unit, the shielding frame comprises a second elastic coupling unit, the first elastic coupling unit comprises a plurality of first elastic sheets, the first elastic sheets extend in a first direction, the second elastic coupling unit comprises a plurality of second elastic sheets, the second elastic sheets extend in a second direction, and the first direction is opposite to the second direction,
wherein a first gap is formed between two adjacent ones of the first elastic sheets, the first gap is $1/50 \sim 1/20$ of a wavelength of the interference signal.

* * * * *